United States Patent [19]
Bartoli et al.

[11] Patent Number: 5,994,948
[45] Date of Patent: Nov. 30, 1999

[54] CMOS TWIN-TUB NEGATIVE VOLTAGE SWITCHING ARCHITECTURE

[75] Inventors: Simone Bartoli; Antonio Russo; Mauro Luigi Sali, all of Milan, Italy

[73] Assignee: SGS-Thomson Microelectronics S.R.L., Agrate Brianza, Italy

[21] Appl. No.: 08/921,930

[22] Filed: Aug. 27, 1997

[51] Int. Cl.⁶ .................................................. G05F 1/10
[52] U.S. Cl. ......................... 327/536; 327/540; 327/415
[58] Field of Search .................................. 327/535, 536, 327/537, 589, 390, 540, 415, 416, 417

[56] References Cited

U.S. PATENT DOCUMENTS

| | | | |
|---|---|---|---|
| 5,029,282 | 7/1991 | Ito | 307/296.1 |
| 5,043,858 | 8/1991 | Watanabe | 363/61 |
| 5,093,586 | 3/1992 | Asari | 307/296.1 |
| 5,140,182 | 8/1992 | Ichimura | 307/296.1 |
| 5,335,200 | 8/1994 | Coffman et al. | 365/218 |
| 5,668,494 | 9/1997 | Nicollini et al. | 327/416 |
| 5,754,476 | 5/1998 | Caser et al. | 365/185.29 |

*Primary Examiner*—Kenneth B. Wells
*Assistant Examiner*—Hai L. Nguyen
*Attorney, Agent, or Firm*—Allen, Dyer, Doppelt, Milbrath & Gilchrist, P.A.

[57] ABSTRACT

A CMOS twin-tub negative voltage switching architecture is for a non-volatile memory device and includes a negative voltage multiplier for generating a increased voltage value starting from a single main power supply. A voltage regulator feedback is connected to the voltage multiplier for regulating the generated negative voltage value; and a plurality of independent switch circuits each one receiving as an input the negative voltage value and producing as an output a predetermined local negative voltage.

23 Claims, 5 Drawing Sheets

CM OS TWIN-TUB NEGATIVE VOLTAGE SWITCHING ARCHITECTURE

FIELD OF THE INVENTION

The present invention relates to a CMOS twin-tub negative voltage switching architecture.

BACKGROUND OF THE INVENTION

As is known, electronic memory devices using a single power supply, such as Flash Electrically Erasable Programmable Read-Only Memories (EEPROMs) having a 3 Volt main power supply, require positive voltages higher that the main power supply for the reading, writing and erasing phases. These devices also require negative voltages less than the ground voltage reference for the reading and erasing phases. Voltage multipliers or charge pump circuits are widely used in these semiconductor electronic devices to internally generate voltage supplies whose values are higher or less than a main power supply and many prior art approaches are known for charge pump circuits providing the above required voltage values.

However, generating the positive or negative increased voltage value is not enough to guarantee correct operation of the memory device, since many operating phases require a specific voltage value which must be obtained from the increased voltage. For instance, during the reading, erasing and programming phases of different pages of a non-volatile memory array, many different negative voltage values would be required to drive properly a final decoder stage of each memory page. To generate and supply these negative voltage values to the different memory pages have up to now, required complex regulating circuits which occupy a large semiconductor area of the integrated circuit memory. Moreover, such regulating circuits limit the performance of the memory device to being slow in switching among the different voltage values. In other words, means for selectively generating within a Flash EEPROM device a predetermined number of negative voltages, starting from a single voltage value, while desirable, is not currently available in an efficient manner.

SUMMARY OF THE INVENTION

One object of the invention is that of providing a switching architecture for generating and controlling a negative increased voltage to be used during the row decoding phase of a non-volatile memory device.

Another object of the present invention is that of providing a set of negative voltages to use during the stand-by phase, the reading phase and the modify phase of a non-volatile memory device.

A further object of the present invention is that of providing a negative voltage for the page selection of the memory array, so that a selected page of the memory device can be erased and replaced with new data without effecting the other pages of the memory array.

A further object of the present invention is that of providing a set of negative voltages for a Flash EEPROM memory device being supplied by a single positive main power supply, such as Vcc=3V.

The invention is based upon generating all the required and independent negative voltages by using a single voltage multiplier and a multiple switching architecture. More particularly, the technical problems are solved by a CMOS twin-tub negative voltage switching architecture comprising a negative voltage multiplier for generating an increased voltage value starting from a single main power supply; a voltage regulator feedback connected to the voltage multiplier for regulating the generated negative voltage value; and a plurality of independent switch circuits, each one receiving as an input the negative voltage value and producing as an output a predetermined local negative voltage.

The features and advantages of the CMOS voltage switching architecture according to the invention will be appreciated by the following description of a preferred embodiment given by way of non-limiting example with reference to the annexed drawings.

DETAILED DESCRIPTION OF THE PREFERRED EMBODIMENTS

Figure 1:
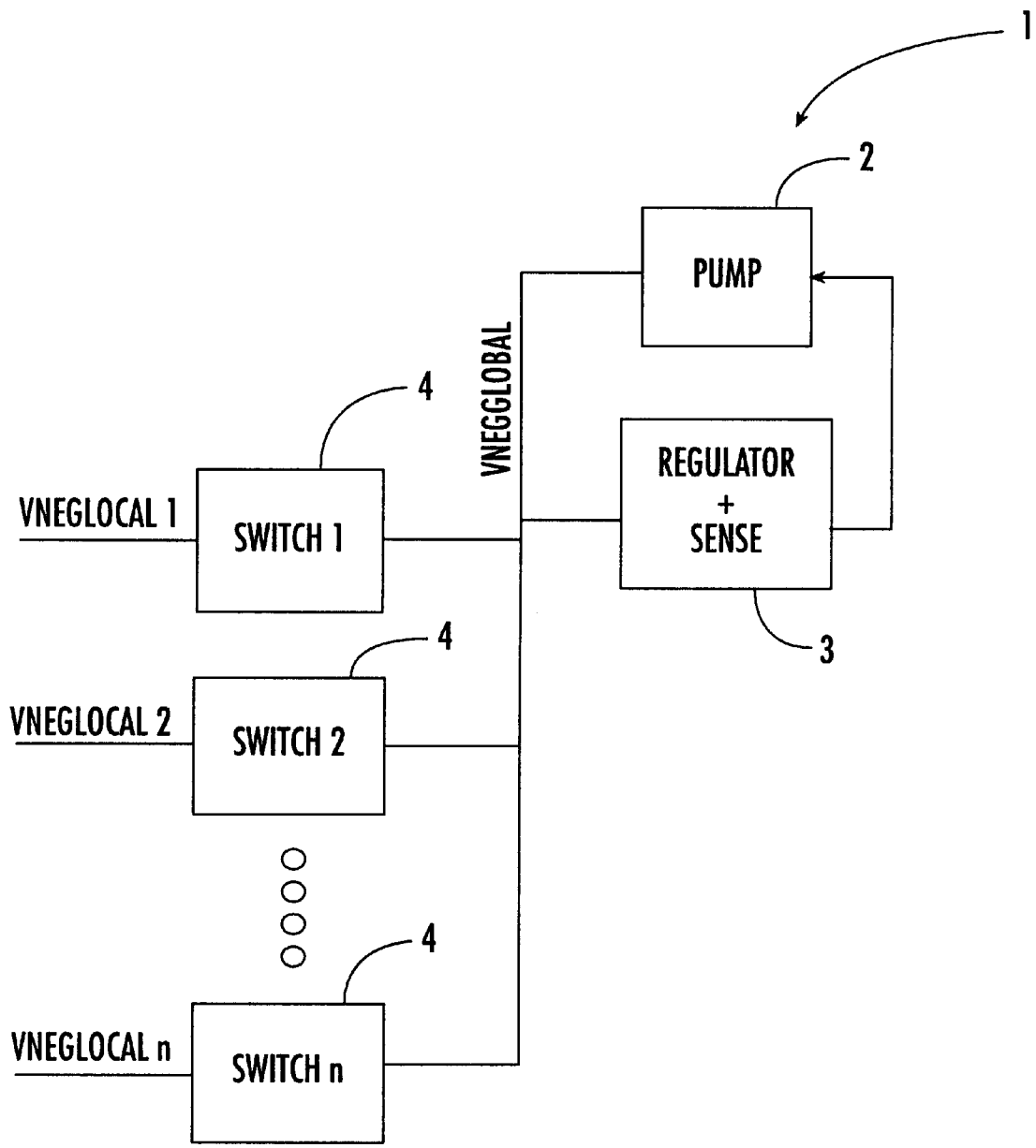
FIG. 1 shows a simplified schematic diagram of a CMOS twin-tub negative voltage switching architecture according to the present invention.

With reference to the above figures, a negative voltage switching architecture according to the present invention is globally indicated with reference numeral 1. The architecture 1 is realized with a 0.6 $\mu$m CMOS twin-tub process with two metalization layers. The architecture according to the present invention is specifically designed for a non-volatile Flash EEPROM electronic memory device. Such a memory device is a 4 Mbit Flash EEPROM with a single main power supply of 3 V. The memory matrix is segmented in eleven pages. Seven pages include 64 K bytes; one page includes 32 Kbytes; one page includes 16 Kbytes and two pages include 8 Kbytes.

The architecture 1 comprises negative voltage multiplier 2 for generating an increased voltage value Vnegglobal starting from the single 3 V positive power supply Vcc. The voltage multiplier 2 is substantially a four phase negative charge pump circuit including P-channel MOS transistors. The architecture 1 also includes a voltage regulator 3 which is feedback connected to the voltage multiplier 2 for regulating the generated negative voltage value Vnegglobal which is also referred to a Vdep.

Figure 5:
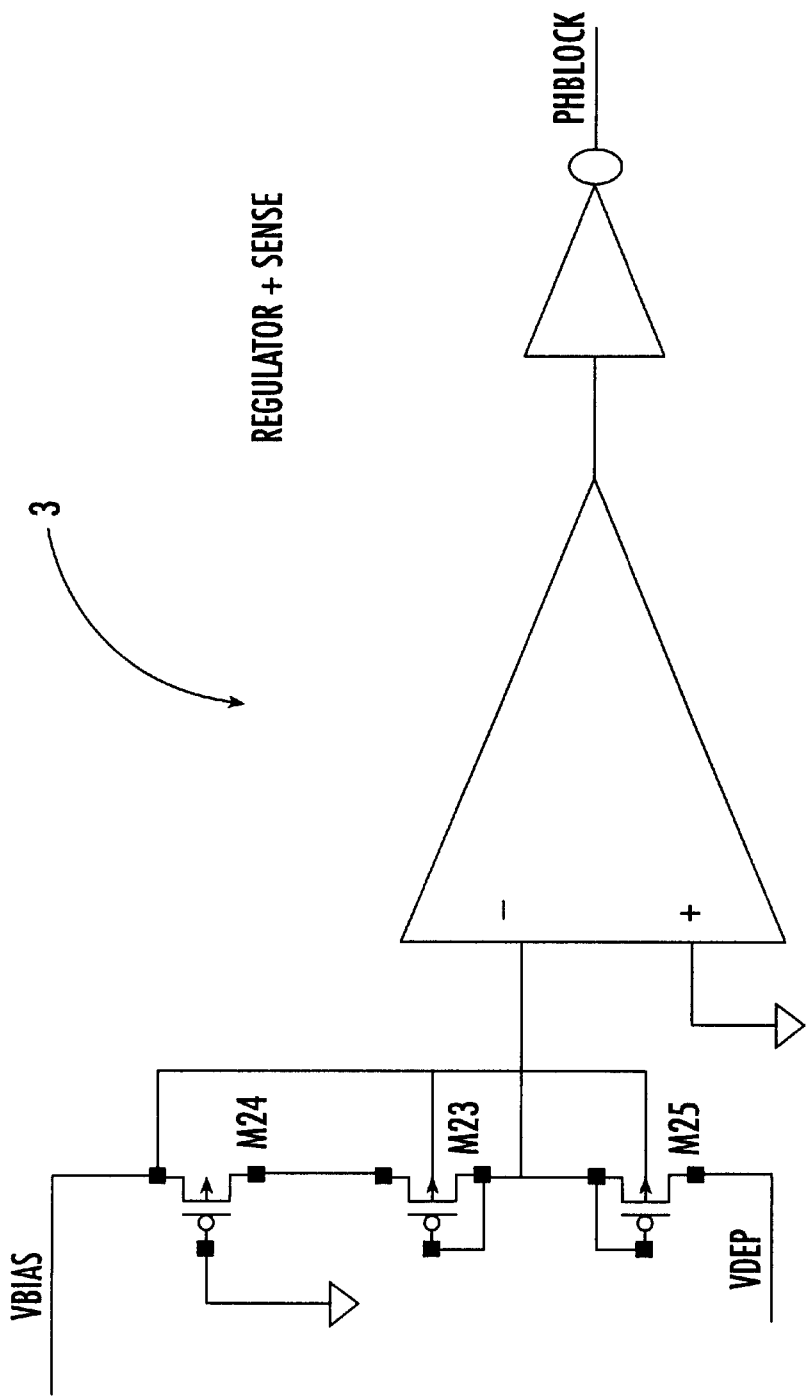
FIG. 5 shows a simplified schematic diagram of a voltage regulator circuit structure incorporated into the inventive architecture.

The inside structure of the voltage regulator 3 is shown in FIG. 5 where it can be appreciated that the voltage regulator 3 includes a differential amplifier having the inverting input connected to a voltage divider comprising a series of diodes. The output of the amplifier is connected to the voltage multiplier via an inverter. The regulator output is active in turning off the voltage multiplier 2 when the voltage Vdep exceeds a predetermined regulated value.

According to the invention, a plurality of N independent switch circuits 4 is provided in connection with the output of the voltage multiplier 2. Each switch circuit 4 receives as an input the negative voltage value and produces as an output a predetermined local negative voltage as will be detailed in the following description. The switch circuits 4 are analog circuits which operate as driven ON/OFF switches in response to control signals. They are all connected to the voltage multiplier output but, when one switch circuit 4 is OFF, the local output voltage of that switch circuit is isolated from the negative voltage value generated by the voltage multiplier 2 and it is possible to regulate such a local output voltage without effecting the operation of the other switch circuits 4.

Figure 2:
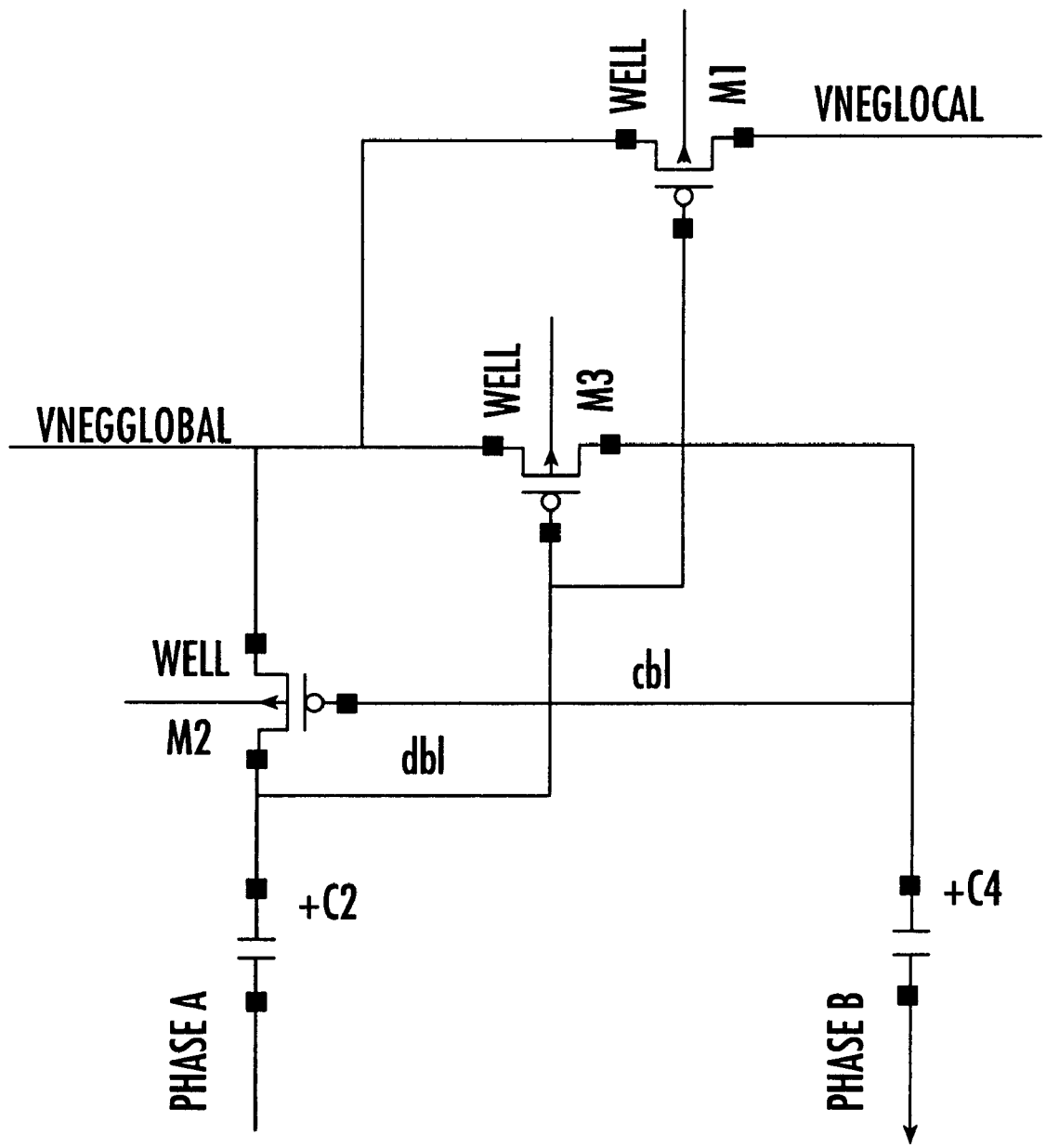
FIG. 2 shows a schematic diagram of a switch circuit integrated into the switching architecture of FIG. 1.

FIG. 2 shows a schematic diagram of the inside structure of a switch circuit 4. Each switch circuit 4 comprises a pair of P-Channel MOS transistors M2 and M3, each having a first and a second conduction terminal and a control terminal. These transistors M2, M3 have their first conduction terminals connected together as switch circuit input, and receiving the negative voltage reference Vnegglobal from the voltage multiplier output. The control terminal of each transistor is connected to the second conduction terminal of the other transistor of the switch circuit 4.

A phase signal A is applied to the second conduction terminal of the first transistor M2 via a first coupling capacitor C2. A second phase signal B is applied to the second conduction terminal of the second transistor M3 via a second coupling capacitor C4. Those phase signals are non-overlapping. Therefore, a first phase signal dbl is applied to the control terminal of the second transistor M3, while a second phase signal cbl is applied to the control terminal of the first transistor M2. The capacitance value of the first capacitor C2 is much smaller than the capacitance value of the second capacitor C4 (C2<<C4).

A further P-channel MOS transistor M1 is provided in connection with the first and second transistors M2, M3. The gate terminal of this transistor M1 is connected to the gate terminal of the second transistor M3 and to the second conduction terminal of the first transistor M2. One conduction terminal of this further transistor M1 is connected to the input terminal of the switch circuit 4, while the other conduction terminal of the transistor M1 outputs a negative local voltage value Vneglocal. The transistor M1 works as a pass-transistor and its gate terminal is controlled by the phase signal dbl when the transistor must be cut off.

The first and second transistors M2, M3 and the coupling capacitors C2, C4 form a charge pump structure to control the gate terminal of the pass-transistor M1. The first and second phase signals A and B are taken from the set of four phase signals applied to the negative charge pump voltage multiplier circuit 2. In this manner the maximum pumping effect corresponds to the maximum conduction period of the pass-transistor M1.

Figure 3:
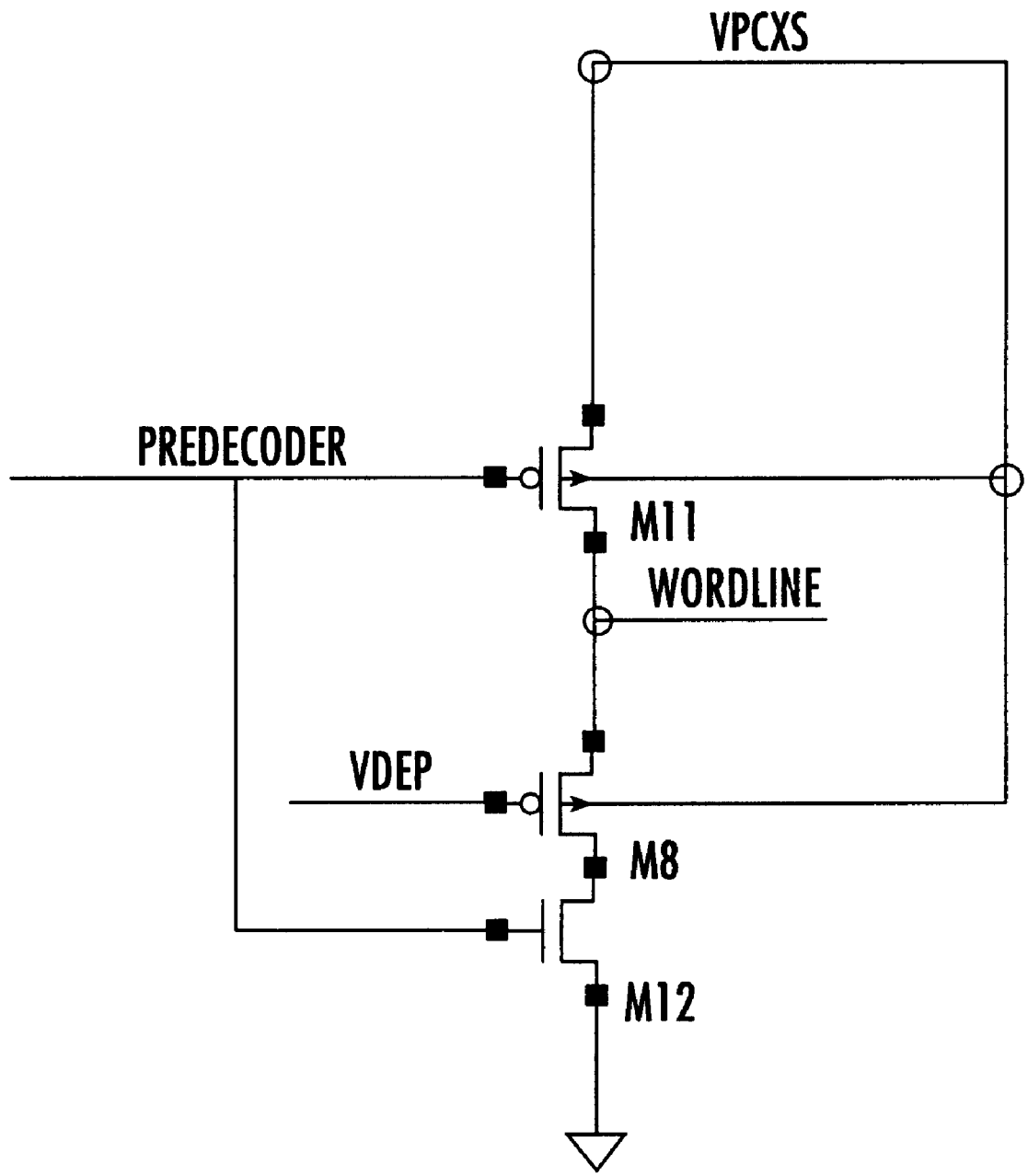
FIG. 3 shows a schematic diagram of a known circuit portion included in a final stage of a row decoder driver for a page of a non-volatile memory device.
Figure 4:
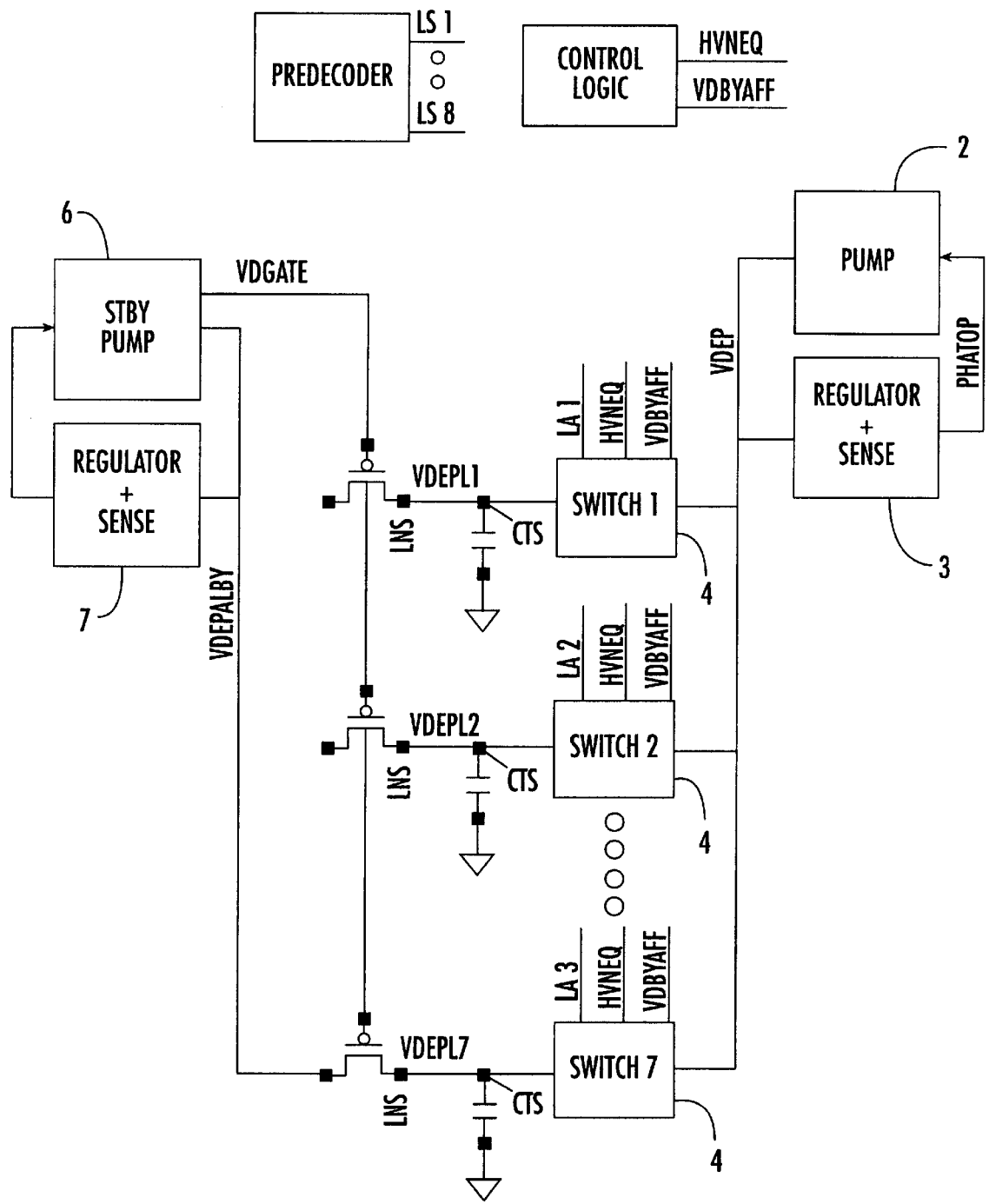
FIG. 4 shows a schematic diagram concerning an implementation of the switching architecture according to the invention.

FIG. 4 shows a schematic diagram concerning a possible implementation of the switching architecture according to the invention. Even if the memory matrix is segmented in eleven pages, the 32 K bytes pages and the other 16 K bytes and 8 K bytes pages may be considered as a single 64 K bytes page. Therefore, FIG. 4 illustrates just eight switch circuits 4 connected to the output of the voltage multiplier 2. The output of the voltage multiplier 2 has been indicated with Vdep to specify a voltage value which is used during the reading, programming and erasing phases of the EEPROM memory device. This specific voltage value Vdep will be discussed later with reference to FIG. 3.

FIG. 4 also shows a secondary stand-by charge pump circuit 6 which is connected to all the outputs of the switch circuits 4. A voltage regulator 7 which is feedback connected to the secondary charge pump for regulating the generated negative voltage value Vdepstby.

Let's now take in consideration the operation of the negative switching architecture 1 according to the invention. To do so we will make reference to FIG. 3 which shows a schematic diagram of a known circuit portion included in a final stage of a row decoder driver of a page of the non-volatile memory device to which the inventive architecture is applied. This figure shows just a series of MOS transistors of a final driver stage including a CMOS pair M11, M12. A third transistor M8 is provided between the pair M11, M12 to isolate the N-Channel transistor M12 during the erasing phase of the memory array. Such a transistor M8 is driven by a voltage value Vdep which is applied to its control terminal.

When the memory device is activated, after a Power On Reset signal, the voltage multiplier 2 and the switch circuits 4 are ON. Also the voltage regulator 3 is On and turns off the voltage multiplier and the switch circuits 4 when the Vdep reaches the value −4V. Circuit means, not shown, are also provided to drive to ground potential the well regions of the P-Channel transistors to reduce oxide stress and the body effect when the local Vdep has reached appropriate negative values.

The transistor M8 must be in the ON state during a reading phase and to achieve this result a negative voltage value Vdep of at least −3.5 V must be applied to the control terminal of this transistor M8. The −3.5 V voltage value Vdep must be maintained even during the stand-by phase since in this situation the voltage multiplier 2 is OFF and a secondary stand-by low consumption charge pump (shown in FIG. 4) is used to keep the leakage. During the stand-by phase the voltage regulator 3 is turned off while the secondary stand-by pump is active with its corresponding voltage regulator 7. The voltage multiplier 2 and the switch circuits 4 remain inactive until the next POR signal.

Let's now consider the programming phase of the memory page. The wordline of the selected cell must assume a 10.5 V potential value. To save the gate oxide layer of the P-channel MOS transistor M8 during the programming phase it's necessary to apply a positive voltage Vcc−Vth on the transistor M8 control terminal. All the other pages of the memory device continue to receive a negative Vdep, corresponding to −3.2 V, since only the page to be programmed requires a positive voltage on the gate of transistor M8. Therefore, during the programming phase the voltage Vdep must assume a positive value but, at the end of the programming phase, such a voltage value Vdep must be brought as fast as possible to the negative value of −3.5 V to guarantee a correct reading during the subsequent verify phase.

During the erasing phase of the memory page the transistor M8 is OFF and the wordline assumes a negative potential. During the negative pulse all the switch circuits 4 are turned off and the local Vdep are set to Vcc−Vth. Even the global Vdep is brought to Vcc−Vth. At the end of the erasing phase all the switch circuits 4 are re-activated and the local Vdep voltages return to be negative.

In the following table the different values of Vdep are summarized according to the corresponding operating phase of the memory page:

TABLE

| | Vdep Values | | | |
| --- | --- | --- | --- | --- |
| | Stby | Reading | Program | Erasing |
| Selected Page | −3.5 V | −3.5 V | Vcc−Vth | Vcc−Vth |
| Non-Selected Page | — | — | −3.2 V | Vcc−Vth |

Each local Vdep is associated to a capacitance of at least 20 pF which is substantially given by the contribution of the capacitor C2 and C4 in each switch circuit 4. If we consider the eight pages of the memory matrix, the whole capacitance is more or less given by 160 pF. However, since the generation of the local positive voltage Vdep is segmented for each page of the memory device, just the 20 pF capacitance is present during the switching phase after programming; the remaining 140 pF represent a charge sharing which is negative charged and supports the switching phase.

That which is claimed is:

1. A CMOS twin-tub negative voltage switching architecture for a non-volatile memory device and comprising:
   a negative voltage multiplier for generating an increased negative voltage from a main power supply;
   a voltage regulator feedback circuit connected to said negative voltage multiplier for regulating the negative voltage; and
   a plurality of independent switch circuits, each switch circuit having an input for receiving the negative voltage from said negative voltage multiplier and having an output for a predetermined different respective local negative voltage;
   at least two of said plurality of independent switch circuits for simultaneously providing said respective predetermined local negative voltage.

2. A CMOS twin-tub negative voltage switching architecture according to claim 1, wherein said negative voltage multiplier is a negative charge pump.

3. A CMOS twin-tub negative voltage switching architecture according to claim 1, wherein each one of said switch circuits further comprises:
   a pass transistor having a control terminal and conduction terminals, the conduction terminals connected between the input and the output; and
   a charge pump connected to the control terminal of said pass transistor.

4. A CMOS twin-tub negative voltage switching architecture according to claim 3, wherein said charge pump comprises:
   first and second P-channel MOS transistors each having first and second conduction terminals and a control terminal, the first conduction terminals of the first and second P-channel MOS transistors being connected together and to the input, the control terminal of each of the first and second P-channel MOS transistors being connected to the second conduction terminal of the other transistor of the charge pump;
   a first coupling capacitor connected to the second conduction terminal of the first P-channel MOS transistor for receiving a first phase signal
   a second coupling capacitor connected to the second conduction terminal of the second P-channel MOS transistor for receiving a second phase signal.

5. A CMOS twin-tub negative voltage switching architecture according to claim 4, wherein the first and second phase signals are non-overlapping.

6. A CMOS twin-tub negative voltage switching architecture according to claim 4, wherein the first coupling capacitor has a capacitance value much smaller than the second coupling capacitor.

7. A CMOS twin-tub negative voltage switching architecture according to claim 3, wherein said pass-transistor is a P-channel MOS transistor.

8. A CMOS twin-tub negative voltage switching architecture according to claim 1, further comprising circuit means for driving to ground potential well regions of the first and second P-channel MOS transistors to thereby reduce oxide stress and a body effect when the local negative voltage reaches a predetermined value.

9. A CMOS twin-tub voltage switching architecture comprising:
   a voltage multiplier for generating an increased voltage;
   a voltage regulator feedback circuit connected to said voltage multiplier for regulating the increased voltage; and
   a plurality of independent switch circuits, each switch circuit having an input for receiving the increased voltage from said voltage multiplier and having an output for a predetermined different respective local voltage;
   at least two of said plurality of independent switch circuits for simultaneously providing said respective predetermined local negative voltage.

10. A CMOS twin-tub voltage switching architecture according to claim 9, wherein said voltage multiplier is a charge pump.

11. A CMOS twin-tub voltage switching architecture according to claim 9, wherein each one of said switch circuits further comprises:
   a pass transistor having a control terminal and conduction terminals, the conduction terminals connected between the input and the output; and
   a charge pump connected to the control terminal of said pass transistor.

12. A CMOS twin-tub voltage switching architecture according to claim 11, wherein said charge pump comprises:
   first and second transistors each having first and second conduction terminals and a control terminal, the first conduction terminals of the first and second transistors being connected together and to the input, the control terminal of each of the first and second transistors being connected to the second conduction terminal of the other transistor of the charge pump;
   a first coupling capacitor connected to the second conduction terminal of the first transistor for receiving a first phase signal
   a second coupling capacitor connected to the second conduction terminal of the second transistor for receiving a second phase signal.

13. A CMOS twin-tub voltage switching architecture according to claim 12, wherein the first and second phase signals are non-overlapping.

14. A CMOS twin-tub voltage switching architecture according to claim 12, wherein the first coupling capacitor has a capacitance value much smaller than the second coupling capacitor.

15. A CMOS twin-tub voltage switching architecture according to claim 12, wherein each of said first and second transistors is a P-channel MOS transistor, and wherein said pass-transistor is a P-channel MOS transistor.

16. A CMOS twin-tub voltage switching architecture according to claim 15, further comprising circuit means for driving to ground potential well regions of the first and second P-channel MOS transistors to thereby reduce oxide stress and a body effect when the local negative voltage reaches a predetermined value.

17. A non-volatile memory device comprising:
   a CMOS twin-tub negative voltage switching architecture comprising
      a negative voltage multiplier for generating an increased negative voltage from a main power supply,
      a voltage regulator feedback circuit connected to said negative voltage multiplier for regulating the increased negative voltage, and
      a plurality of independent switch circuits, each switch circuit having an input for receiving the increased negative voltage from said negative voltage multiplier and having an output for a predetermined different respective local negative voltage;

at least two of said plurality of independent switch circuits for simultaneously providing said respective predetermined local negative voltage.

18. A non-volatile memory device according to claim 17, wherein said negative voltage multiplier is a negative charge pump.

19. A non-volatile memory device according to claim 18, wherein each one of said switch circuits further comprises:

a pass transistor having a control terminal and conduction terminals, the conduction terminals connected between the input and the output; and a charge pump connected to the control terminal of said pass transistor.

20. A non-volatile memory device according to claim 19, wherein said charge pump comprises:

first and second P-channel MOS transistors each having first and second conduction terminals and a control terminal, the first conduction terminals of the first and second P-channel MOS transistors being connected together and to the input, the control terminal of each of the first and second P-channel MOS transistors being connected to the second conduction terminal of the other transistor of the charge pump;

a first coupling capacitor connected to the second conduction terminal of the first P-channel MOS transistor for receiving a first phase signal a second coupling capacitor connected to the second conduction terminal of the second P-channel MOS transistor for receiving a second phase signal.

21. A non-volatile memory device according to claim 20, wherein the first and second phase signals are non-overlapping.

22. A non-volatile memory device according to claim 20, wherein the first coupling capacitor has a capacitance value much smaller than the second coupling capacitor.

23. A non-volatile memory device according to claim 19, wherein said pass-transistor is a P-channel MOS transistor.

* * * * *